United States Patent [19]

Matsushita et al.

[11] 4,370,421
[45] Jan. 25, 1983

[54] ELECTRICALLY INSULATING SUBSTRATE AND A METHOD OF MAKING SUCH A SUBSTRATE

[75] Inventors: Yasuo Matsushita; Yukio Takeda; Kousuke Nakamura; Tokio Okoshi, all of Hitachi, Japan

[73] Assignee: Hitachi, Ltd., Tokyo, Japan

[21] Appl. No.: 203,554

[22] Filed: Nov. 5, 1980

[30] Foreign Application Priority Data

Nov. 5, 1979 [JP] Japan .................................. 54-142059
Jun. 6, 1980 [JP] Japan .................................. 55-75601

[51] Int. Cl.³ .................... C04B 35/56; C22C 29/00
[52] U.S. Cl. ......................................... 501/88; 264/65; 501/89; 501/90
[58] Field of Search .............. 106/44; 264/65; 501/88, 501/89, 90

[56] References Cited

U.S. PATENT DOCUMENTS

| | | | |
|---|---|---|---|
| 3,205,080 | 9/1965 | Ryshkewitch | 501/88 |
| 3,993,602 | 11/1976 | Prochazka | 106/44 X |
| 4,023,975 | 5/1977 | Prochazka | 106/44 |
| 4,123,286 | 10/1978 | Coppola et al. | 106/44 |
| 4,141,726 | 2/1979 | Yajima et al. | 75/204 X |
| 4,172,109 | 10/1979 | Smoak | 264/65 |

FOREIGN PATENT DOCUMENTS 956911 4/1964 United Kingdom .
2031027 4/1980 United Kingdom .

OTHER PUBLICATIONS

Blodgett, A. J. et al., "Composite Structures for Modifying Coefficient of Expansion", IBM Technical Disclosure Bull. 11 (11), Apr. 1969.
Chem. Abstr. 94 (Feb. 23, 1981), p. 291, 51821s, "Silicon Carbide Sinter".
Jpn. Kokai Tokkyo Koho, 80, 85,469 patent application of Japan pub'd. 06/27/80.

Primary Examiner—Helen M. McCarthy
Attorney, Agent, or Firm—Antonelli, Terry & Wands

[57] ABSTRACT

From 0.1 to 3.5% by weight of beryllium oxide powder, calculated as beryllium, is added to silicon carbide powder containing up to 0.1% by weight of aluminum, up to 0.1% by weight of boron and up to 0.4% by weight of free carbon, and the mixed powder is pressure-molded. The resulting molded article is heated to a temperature of 1,850° C. to 2,500° C. till there is obtained a sintered body having at least 90% relative density of silicon carbide. Thus, the sintered body having thermal conductivity of at least 0.4 cal/cm.sec.° C. at 25° C., electrical resistivity of at least $10^7$ Ohm.cm at 25° C. and coefficient of thermal expansion of $3.3 \sim 4 \times 10^{-6}$/°C. at 25° C. to 300° C. can be obtained.

8 Claims, 6 Drawing Figures

ELECTRICALLY INSULATING SUBSTRATE AND A METHOD OF MAKING SUCH A SUBSTRATE

BACKGROUND OF THE INVENTION

This invention relates to an electrically insulating substrate having high thermal conductivity and high electric resistivity and also to a method of making such a substrate.

The semiconductor industry has made a remarkable progress in recent years and a number of circuit constituents such as semiconductor chips have been formed in increasingly higher density on an insulating substrate used in large scale integration circuit and the like. Demands for devices having greater capacity with smaller size have also become keener and insulating substrates having high thermal diffusivity have been required.

As materials for such an insulating substrate, there has conventionally been employed an alumina sintered body. Since the alumina sintered body does not have satisfactory thermal diffusivity, however, development of an insulating substrate having higher thermal diffusivity has been requested. The insulating substrate for such an application must satisfy the following requirements.
(1) high electrically insulating property,
(2) high thermal conductivity,
(3) its coefficient of thermal expansion is approximate to that of silicon, and
(4) high mechanical strength.

A sintered body of silicon carbide has a coefficient of thermal expansion of $3.7 \times 10^{-6}/°C$. which is smaller than the coefficient of thermal expansion of alumina, i.e., about $8 \times 10^{-6}/°C$. and is approximate to that of silicon, i.e., about $3.3 \times 10^{-6}/°C$. As to the mechanical strength of silicon carbide, its bending strength is at least 50 Kg/mm$^2$, the value being by far higher than that of alumina, i.e., ca. 25 to 30 Kg/mm$^2$. Further, the thermal conductivity of silicon carbide sintered body is 0.1 to 0.2 cal/cm.sec.°C. which is at least three times that of alumina.

Silicon carbide is a semiconductor compound of the Group IV—IV consisting of carbon and silicon. For this reason, it has been believed difficult to obtain a high density sintered body of silicon carbide with high electrical resistivity and as a matter of fact, no such sintered body has been found to this date.

On the other hand, it has been known well that since silicon carbide is a compound having high covalent bond, it is hard and tough and is stable both in oxidation resistance and corrosion resistance even at a temperature of 1,500° C. or above. Due to this strong covalent bond, however, it is a material from which a high ensity sintered body can not be obtained easily.

Various sintering aids have been employed in order to obtain a high density sintered body of silicon carbide. U.S. Pat. No. 4,172,109, for example, discloses a sintered body of silicon carbide which is sintered while Be is added as the aid. This prior art relates to a high strength material obtained by sintering the raw powder of silicon carbide which contains 0.5 to 5 wt.% of excessive carbon. However, the sintered body thus formed has small electric resistivity and can not be used as an electrically insulating material.

SUMMARY OF THE INVENTION

It is an object of the present invention to provide an electrically insulating substrate consisting of silicon carbide as its principal component and having high thermal conductivity, and also to provide a method of making such a substrate.

The electrically insulating substrate in accordance with the present invention is formed by adding 0.1 to 3.5 wt.% of beryllium oxide powder, calculated as beryllium, to silicon carbide powder as the principal component, pressure-molding the mixed powder and then sintering the resulting molded article at such a temperature and pressure sufficient to provide 90% relative density. Here, the aluminum, boron and free carbon components in the silicon carbide powder are restricted to at most 0.1 wt.%, at most 0.1 wt.% and at most 0.4 wt.%, respectively. The thermal conductivity at 25° C. of the electrically insulating substrate obtained from this sintered body is at least 0.4 cal./cm.sec.°C. while its electrical resistivity at 25° C. is at least 10$^7$ ohm.cm. Further, its coefficient of heat expansion from 25° C. to 300° C. is up to $3.7 \times 10^{-6}/°C$.

In the present invention, the amount of beryllium in the sintered body is restricted to from 0.1 to 3.5 wt.% for the following reason. If it is below 0.1 wt.%, the electrical resistivity becomes smaller than 10$^7$ ohm.cm while if it exceeds 3.5 wt.%, the thermal expansion coefficient of the sintered body becomes greater than $4 \times 10^{-6}$°C., thus rendering a critical problem when the sintered body is used as an insulating substrate especially for silicon semiconductor elements.

It is advisable to add beryllium as BeO. The addition is made by mixing the BeO powder and the silicon carbide powder. If about 0.5 to 14 wt.% of BeO is added in this case, Be in the sintered body accounts for about 0.1 to 3.5 wt.%. However, these values vary to some extents depending upon the atmosphere and temperature during the sintering.

It is another important requirement in the present invention that the silicon carbide powder does not contain more than 0.4 wt.% of free carbon. The presence of free carbon in such an amount markedly reduces the electrical resistivity as one of the objects of the present invention.

In the present invention, the abovementioned beryllium oxide powder and silicon carbide powder are minute powder having an average grain size of up to 10 μm, preferably up to 2 μm, and the powder is sintered by hot-pressing. Though aluminum and boron are not contained preferably in the sintered body, there is no problem if their contents are below 0.1 wt.%, respectively. If aluminum is contained in a greater amount, the electrical resistivity of the sintered body becomes below 10$^7$ Ohm.cm disadvantageously. If boron is contained in a greater amount, the thermal conductivity becomes smaller than 0.4 cal/cm.sec.°C.

If it is desired to obtain a sintered body having a thermal conductivity of at least 0.5 cal/cm.sec.°C., it is recommended to sinter the silicon carbide powder whose principal component is alpha-type SiC.

The sintering condition of BeO-containing silicon carbide powder is also an important factor, and specifically, sintering must be carried out in a non-oxidizing atmosphere. In an oxidizing atmosphere, the surface of the silicon carbide powder is oxidized so that a high density sintered body can not be obtained. On the other hand, furnace materials that can be used in an oxidizing atmosphere at a temperature of about 2,000° C., are not availble at present.

The sintering temperature is from 1,850° to 2,500° C., preferably from 1,900° to 2,300° C. If the temperature is lower than 1,850° C., a high density sintered body can not be obtained while at a sintering temperature higher than 2,500° C., sublimation of silicon carbide becomes so vigorous that the sintered body is excessively sintered and hence, is not changed into a compact ceramic. In the hot press method which applies a high pressure to the sample during sintering, the upper limit of the pressurizing load varies with the material of dies to be employed. Generally, the dies are made of graphite and in that case, a pressure of up to about 700 Kg/cm$^2$ may be applied.

Generally, however, it is possible to obtain a high density sintered body without applying such a great pressure. Generally, the pressure ranges from 100 to 300 Kg/cm$^2$. If the silicon carbide powder having a submicron grain size is employed, a compact sintered body (relative density of 90%) can be obtained without applying the pressure. The optimum sintering time can be determined in accordance with the grain size of the raw powder, the sintering temperature and the load applied during the sintering. Generally speaking, a high density sintered body can be obtained within a short sintering time if the grain size of the raw material powder is small, the sintering temperature is high and the load applied during the sintering is great.

DETAILED DESCRIPTION OF THE PREFERRED EMBODIMENTS

Figure 1:
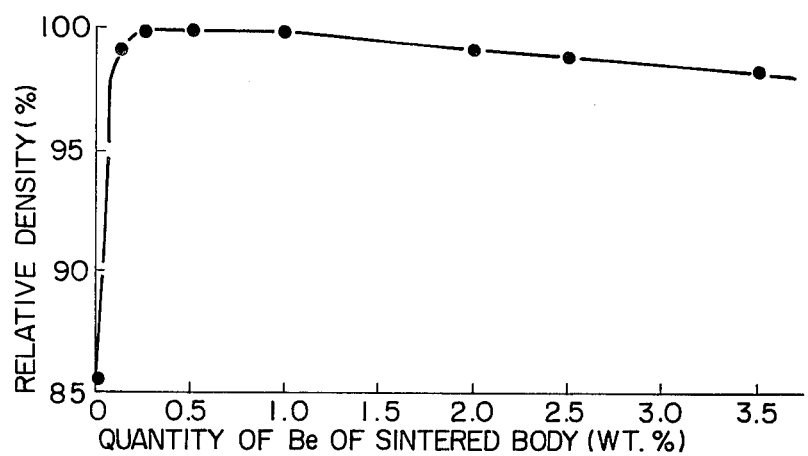
FIG. 1 is a diagram showing the relationship between the Be quantity in the sintered body and the relative density of the sintered body.
Figure 2:
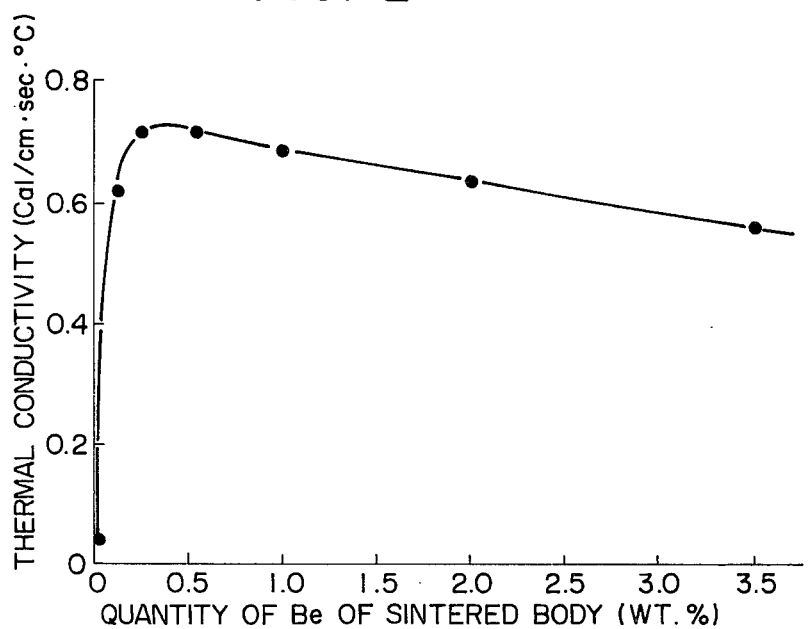
FIG. 2 is a diagram showing the relationship between the Be quantity and the thermal conductivity of the sintered body at 25° C.
Figure 3:
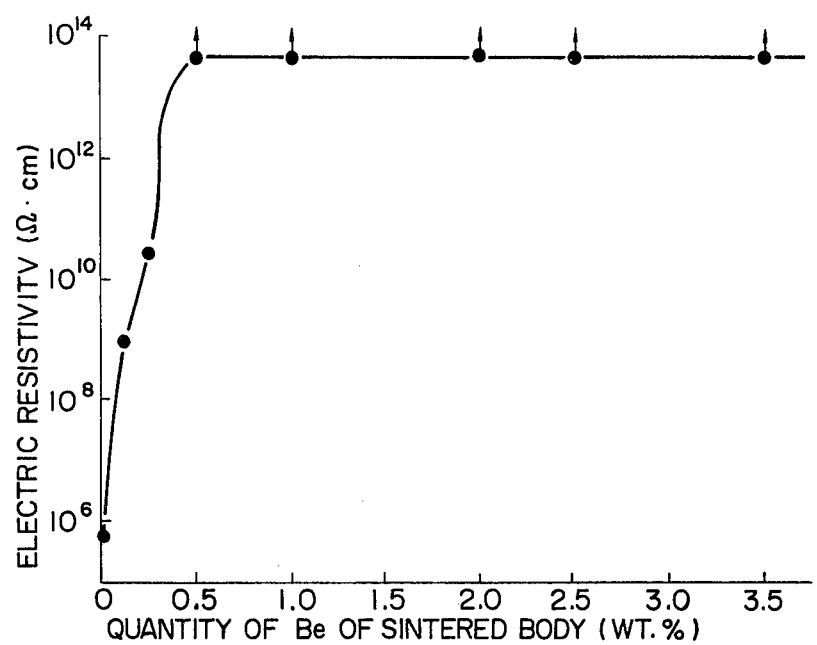
FIG. 3 is a diagram showing the relationship between the Be quantity and the electrical resistivity of the sintered body at 25° C.
Figure 4:
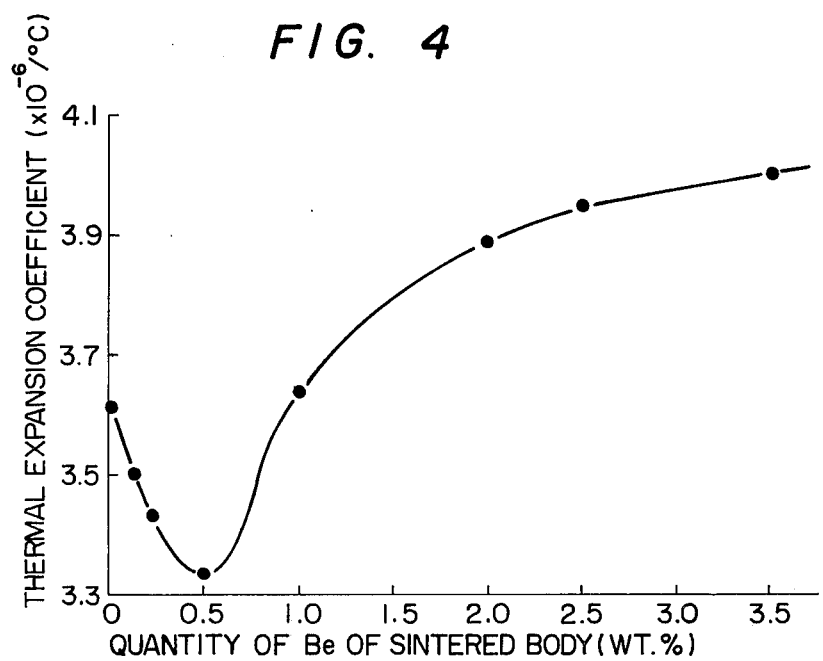
FIG. 4 is a diagram showing the relationship between the Be quantity and the coefficient of thermal expansion of the sintered body from 25° C. to 300° C.

Hereinafter, the present invention will be described more definitely with reference to embodiments thereof.

EXAMPLE 1

Be quantity to be added

Beryllium oxide powder having a grain size of up to 10 μm was mixed with silicon carbide powder of an average grain size of 2 μm in an amount of 0.1 to 20 wt.%. The mixture was shaped into a mold at a room temperature by applying a pressure of 1,000 Kg/cm$^2$. The mold had a density of 1.60 to 1.67 g/cm$^3$ (50 to 52% relative density with respect to the theoretical density of silicon carbide). Next, the molded article was placed in a graphite die and was sintered by a hot press method at a reduced pressure of $1 \times 10^{-5}$ to $1 \times 10^{-3}$ Torr. The sintering pressure was 300 Kg/cm$^2$ and the temperature was raised from room temperature to 2,000° C. in the course of about two hours, was held at 2,000° C. for one hour and was then left cooling by cutting off a heating power source. The pressure was released after the temperature fell below 1,500° C. The relationship between the properties of the silicon carbide sintered body thus produced and the Be quantity is shown in FIGS. 1 through 4.

The results of FIGS. 1 through 4 illustrate that if the Be quantity in the silicon carbide sintered body falls within the range of 0.1 to 3.5 wt.%, there can be obtained a sintered body having high density, high thermal conductivity, high electrical resistivity and low coefficient of thermal expansion ($4 \times 10^{-6}$/°C. or below).

EXAMPLE 2

Condition of hot-press

Mixed powder formed by adding 2 wt.% of BeO powder to silicon carbide powder was hot-pressed in the same way as in Example 1, yielding a sintered body. The Be content in the sintered body in this instance was about 0.4 wt.%. In this example, various sintered bodies were produced by changing the hot-press conditions. Table 1 illustrates the relationship between the properties of the resulting sintered bodies and the hot-press conditions. When sintering was effected at a temperature of 1,850° to 2,500° C. and at a pressure of at least 100 Kg/cm$^2$, there could be obtained sintered bodies having at least 90% density relative to the theoretical density, thermal conductivity of at least 0.4 cal/cm·sec·°C., electric resistivity of at least $10^{11}$ Ohm·cm and coefficient of thermal expansion of about $4.0 \sim 3.3 \times 10^{-6}$/°C.

TABLE 1

| Temp. (°C.) | Pressure (Kg/cm$^2$) | Time (h) | Relative Density (%) | Thermal Conductivity (cal/cm·sec·°C.) | Electrical Resistivity (Ω·cm) | Coefficient of Thermal Expansion ($\times 10^6$/°C.) |
|---|---|---|---|---|---|---|
| 1800 | 300 | 0.5 | 71 | 0.08 | $10^5$ | 3.34 |
| 1850 | 300 | 0.5 | 88 | 0.18 | $10^9$ | 3.33 |
| 2000 | 300 | 0.5 | 98 | 0.67 | $10^{13}$ or more | 3.33 |
| 2200 | 300 | 0.5 | 99 | 0.70 | $10^{13}$ or more | 3.32 |
| 2400 | 300 | 0.5 | 96 | 0.59 | $10^{13}$ or more | 3.34 |
| 2500 | 300 | 0.5 | 90 | 0.40 | $10^{13}$ or more | 3.34 |
| 2000 | 50 | 1.0 | 74 | 0.08 | $10^6$ | 3.33 |
| 2000 | 100 | 1.0 | 95 | 0.41 | $10^{12}$ | 3.33 |
| 2000 | 700 | 0.5 | 99 | 0.72 | $10^{13}$ or more | 3.33 |
| 2000 | 300 | 0.1 | 95 | 0.54 | $10^{12}$ | 3.34 |
| 2000 | 300 | 1.0 | 100 | 0.72 | $10^{13}$ or more | 3.33 |
| 2000 | 300 | 4.0 | 98 | 0.66 | $10^{13}$ or more | 3.34 |

TABLE 1-continued

| Temp. (°C.) | Pressure (Kg/cm²) | Time (h) | Relative Density (%) | Thermal Conductivity (cal/cm · sec · °C.) | Electrical Resistivity (Ω · cm) | Coefficient of Thermal Expansion (× 10⁶/°C.) |
|---|---|---|---|---|---|---|
| 1850 | 300 | 1.0 | 92 | 0.43 | $10^{11}$ | 3.33 |
| 2500 | 100 | 0.3 | 97 | 0.55 | $10^{13}$ or more | 3.34 |
| 2500 | 300 | 0.1 | 98 | 0.51 | $10^{13}$ or more | 3.33 |
| 1850 | 700 | 0.5 | 96 | 0.50 | $10^{13}$ or more | 3.32 |

Remarks:
Thermal conductivity and electrical resistivity were measured at 25° C.
Coefficient of thermal expansion is a mean value of 25 to 300° C.

EXAMPLE 3

Atmosphere

Sintered bodies were produced in the same way as in Example 1 except that the BeO quantity was changed to 3 wt.% and the atmosphere was changed to Ar gas, He gas and $N_2$ gas, respectively. The Be content in the resulting sintered bodies was 0.9 wt.%. The properties of each sintered body were virtually the same as those of the sintered body of Example 1 containing 1 wt.% of Be.

EXAMPLE 4

Grain size of powder

After 2 wt.% of BeO was added to silicon carbide powder having average grain sizes of 0.2 to 20 μm, sintered bodies were produced in the same way as in Example 1 by hot-press method. Table 2 illustrates the relationship between the average grain size of the silicon carbide powder and the relative density of the sintered body. It was found that if the average grain size of the silicon carbide raw powder was below 10 μm, the sintered body was rendered compact to relative density of at least 95%, and the sintered bodies rendered compact to relative density of at least 95% exhibited the same characteristics as the sintered body of Example 1 containing 0.4 wt.% beryllium. In the sintered bodies in which the average grain size was greater than 10 μm and in which compactness was not sufficiently accomplished had thermal conductivity of as low as 0.2 cal/cm.sec. °C. or below and the mechanical strength of as low as 10 Kg/mm² or below.

TABLE 2

| Average grain size (μm) | Relative density (%) |
|---|---|
| 0.2 | 100 |
| 0.5 | 100 |
| 1 | 99 |
| 2 | 99 |
| 5 | 98 |
| 10 | 95 |
| 13 | 86 |
| 20 | 68 |

EXAMPLE 5

Restriction of free carbon

Mixed powder was formed by adding 2 wt.% of BeO powder and 0.3 to 3 wt.%, based on silicon carbide, of carbon black (minute powder of grain size of 0.1 μm or below) as an impurity to the silicon carbide powder. The mixed powder was hot-pressed in the same way as in Example 1, yielding a sintered body. Thus, various sintered bodies were produced by changing the quantity of the carbon black. Table 3 illustrates the relationship between the carbon black quantity and the properties of the sintered bodies. When the carbon black quantity was 0.5 wt.%, the electrical resistivity of the product became $10^6$ Ohm.cm.

TABLE 3

| Carbon black quantity (wt. %) | Relative density (%) | Thermal conductivity (cal/cm · sec · °C.) | Electrical resistivity (Ω cm) | Coefficient of thermal expansion (× $10^{-6}$/°C.) |
|---|---|---|---|---|
| 0.3 | 99 | 0.70 | $10^{13}$ or more | 3.33 |
| 0.4 | 99 | 0.62 | $10^{13}$ | 3.34 |
| 0.5 | 99 | 0.70 | $10^6$ | 3.34 |
| 1.0 | 98 | 0.53 | $10^5$ | 3.35 |

Remarks:
Thermal conductivity and electrical resistivity were measured at 25° C.
Coefficient of thermal expansion is a mean value of 25° C. to 300° C.

EXAMPLE 6

Restriction of aluminum quantity

Sintered bodies of silicon carbide were produced in the same way as in Example 5 except that aluminum nitride powder (minute powder of a grain size of up to 2 μm) was employed as an impurity instead of carbon black of Example 5. Table 4 illustrates the relationship between the aluminum quantity and the properties of each sintered body when the former was changed. It was found that when the aluminum quantity became smaller than 0.1 wt.%, the electrical resistivity of the sintered body became extremely small.

TABLE 4

| Al content in sintered body (wt. %) | Relative density (%) | Thermal conductivity (cal/cm · sec · C.) | Electrical resistivity (Ω cm) | Coefficient of thermal expansion (× $10^{-6}$/°C.) |
|---|---|---|---|---|
| 0.1 | 99 | 0.63 | $10^8$ | 3.34 |
| 0.3 | 99 | 0.57 | $10^5$ | 3.34 |
| 0.5 | 99 | 0.52 | $10^4$ | 3.34 |

Remarks:
Thermal conductivity and electrical resistivity were measured at room temperature.
Coefficient of thermal expansion is a mean value of room temperature to 300° C.

EXAMPLE 7

Restriction of boron quantity

Sintered bodies of silicon carbide were produced in the same way as in Example 5 except that boron nitride powder (minute powder of a grain size of up to 5 μm) was employed instead of the carbon black of Example 5. Table 5 illustrates the relationship between the boron quantity and the properties of the sintered body. It was found that when the boron content was more than 0.1 wt.%, the thermal conductivity of the sintered body was remarkably reduced.

TABLE 5

| B content in sintered body (wt. %) | Relative density (%) | Thermal conductivity (cal/cm · sec · °C.) | Electrical resistivity (Ω cm) | Coefficient of thermal expansion (× 10⁻⁶/°C.) |
|---|---|---|---|---|
| 0.1 | 99 | 0.68 | $10^{13}$ or more | 3.33 |
| 0.5 | 99 | 0.30 | $10^{13}$ | 3.34 |
| 1.0 | 98 | 0.12 | $10^{12}$ | 3.35 |

Remarks:
Thermal conductivity and electrical resistivity were measured at room temperature. Coefficient of thermal expansion is a mean value of room temperature to 300° C.

EXAMPLE 8

Sintering without pressure

As the silicon carbide powder was used one that was synthesized in high frequency heat plasma. The powder was extremely minute powder having a grain size of 200 A to 0.2 μm. BeO powder of an average grain size of 1 μm was added to the silicon carbide powder. Next, after the mixed powder was molded at a pressure of 1,000 Kg/cm², the resulting molded article was sintered in vacuum of $1 \times 10^{-4}$ Torr. Heating was made from room temperature to 2,100° C. in the course of about 2 hours, held at 2,100° C. for 0.5 hour, and was thereafter left cooling by cutting off the heating power source. The Be content in the sintered body was about 0.4 wt.%. Table 6 illustrates the properties of the resulting sintered body. The sintered body was rendered compact and had high thermal conductivity, high electrical resistance and low coefficient of thermal expansion.

TABLE 6

| | |
|---|---|
| Relative density (%) | 99 |
| Thermal conductivity (cal/cm · sec · °C.) | 0.71 |
| Electrical resistivity (Ohm · cm) | $10^{13}$ or more |
| Coefficient of thermal expansion (× 10⁻⁶/°C.) | 3.33 |

Remarks:
Thermal conductivity and electrical resistivity were measured at room temperature. Coefficient of thermal expansion is a mean value of room temperature to 300° C.

EXAMPLE 9

Application example

As a definite example of the electrically insulating substrate in accordance with the present invention, a semiconductor power module was produced using the silicon carbide sintered body of 0.5 wt.% beryllium content obtained in Example 1.

Figure 5:
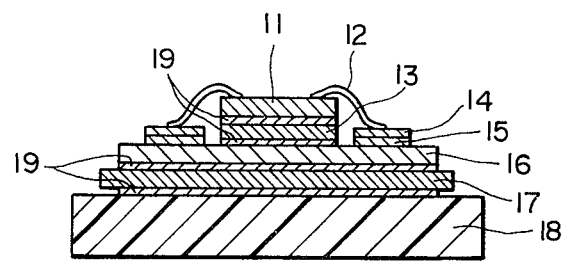
FIG. 5 is a sectional view of a conventional silicon semiconductor device.

FIG. 5 shows the section of a semiconductor power module assembly of the prior art. An organic insulating material 15 is interposed for insulation between a Cu conductor 14 and a Cu heat sink 16 while an aluminum substrate 17 is interposed for insulation between the heat sink 16 and a Cu metal support 18. A spacer 13 is interposed in order to mitigate strain due to the difference of thermal expansion coefficients between a silicon element 11 and the Cu heat sink 16. Reference numeral 12 denotes an aluminum lead wire while reference numeral 19 denotes a solder.

Figure 6:
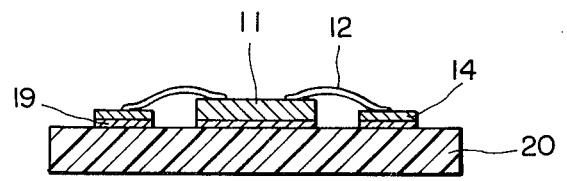
FIG. 6 is a sectional view of a silicon semiconductor device using the insulating substrate of the present invention.

FIG. 6 is a sectional view of the module assembly using the insulating substrate in accordance with the present invention. The substrate 20 of the present invention has an extremely simple construction in which the substrate is directly brazed to the silicon element 11 via the solder 19.

According to the construction shown in FIG. 6, it is possible to replace the spacer 13, the organic insulating material 15, the Cu heat sink 16, the alumina substrate 17 and the metal support 18, each shown in FIG. 5, by the single substrate 20 shown in FIG. 6.

The abovementioned semiconductor device was held at −60° C. for 30 minutes, then at room temperature for 5 minutes and thereafter heated to 125° C. and held at that temperature for 30 minutes. When this heat cycle was applied 20 times to the semiconductor device of the prior art shown in FIG. 5, crack occurred on the alumina substrate and soldered positions peeled off. When the same heat cycle was applied 150 times to the semiconductor device of the present invention shown in FIG. 6, no abnormality was observed.

COMPARATIVE EXAMPLE 1

A sintered body was hot-pressed in the same way as in Example 1 except that no additive was added. The properties of the resulting sintered body were shown in Table 7. Since the sintered body was not rendered compact, all of the thermal conductivity, electrical resistivity and mechanical strength were low.

TABLE 7

| | |
|---|---|
| Relative density (%) | 56 |
| Thermal conductivity (cal/cm · sec · °C.) | 0.04 |
| Electrical resistivity (Ohm · cm) | $10^4$ |
| Coefficient of thermal expansion (× 10⁻⁶/°C.) | 3.66 |

Remarks:
Thermal conductivity and electrical resistivity were measured at room temperature. Coefficient of thermal expansion is a mean value of room temperature to 300° C.

COMPARATIVE EXAMPLE 2

Two percents by weight (2 wt.%) of aluminum oxide was added as an additive to the silicon carbide powder. The mixed powder was molded and hot-pressed in the same way as in Example 1, yielding a sintered body. The properties of the sintered body were shown in Table 8. Though the mechanical strength was high, the thermal conductivity as well as electrical resistivity were low. Similar properties were obtained when aluminum carbide, aluminum nitride and aluminum phosphate were respectively added as the additive to the silicon carbide powder.

TABLE 8

| | |
|---|---|
| Relative density (%) | 99 |
| Thermal conductivity (cal/cm · sec · °C.) | 0.18 |
| Electrical resistivity (Ohm · cm) | 10 |
| Coefficient of thermal expansion (× 10⁻⁶/°C.) | 3.38 |

Remarks:
Thermal conductivity and electrical resistance were measured at room temperature. Coefficient of thermal expansion is a mean value of room temperature to 300° C.

The silicon carbide sintered body in accordance with the present invention is characterized by its high compactness, high thermal conductivity, high electrical resistivity and low coefficient of thermal expansion. Accordingly, the sintered body of the invention is excellent as the afore-mentioned electrically insulating substrate. Further, it can be used suitably as a member for which heat resistance and oxidation resistance are requisites or as a member for which high strength at high temperature is required.

What is claimed is:

1. An electrically insulating substrate comprising a sintered body, said sintered body consisting essentially of 0.1 to 3.5 weight % of beryllium in the form of a compound consisting of beryllium oxide, up to 0.1 weight % of aluminum, up to 0.1 weight % of boron, up to 0.4 weight % of free carbon and a balance of silicon carbide, said sintered body having a density of at least 90% relative density with respect to the theoretical density of said silicon carbide, having a thermal conductivity of at least 0.4 cal/cm.sec.°C. at 25° C., having an electrical resistivity of at least $10^7$ Ohm.cm at 25° C. and having a coefficient of thermal expansion of up to $4 \times 10^{-6}$/°C. from 25° C. to 300° C.

2. The electrically insulating substrate of claim 1 wherein said silicon carbide consists essentially of alpha-type silicon carbide.

3. An electrically insulating substrate according to claim 1, wherein the sintered body has an electrical resistivity of $10^{13}$ Ohm.cm or more, a thermal conductivity of 0.5–0.75 cal/cm.sec.°C., and a relative density of 96–100%.

4. An electrically insulating material comprising a sintered body, said sintered body consisting essentially of 0.1 to 3.5 weight % of beryllium in the form of beryllium oxide and a balance of silicon carbide and having a coefficient of thermal expansion of up to $4 \times 10^{-6}$/°C. from 25° C. to 300° C.

5. The electrically insulating material of claim 4, wherein said sintered body has been sintered so that a density of at least 90% relative density with respect to the theoretical density of the silicon carbide is obtained.

6. A powder composition for forming an electrically insulating material, said composition consisting essentially of 0.1 to 3.5 weight % of beryllium in the form of beryllium oxide powder and a balance of silicon carbide powder.

7. A powder composition of claim 6, wherein said beryllium oxide powder and silicon carbide powder have an average grain size of up to 10 μm.

8. An electrically insulating substrate made of a sintered body having a relative density of 90% or more, said sintered body consisting essentially of 0.1 to 3.5% by weight of beryllium in the form of beryllium oxide and a balance of silicon carbide, said sintered body being produced by sintering a mixture consisting essentially of beryllium oxide and a balance of silicon carbide having an average grain size of up to 10 μm in a non-oxidizing atmosphere at 1850° to 2500° C.

* * * * *